United States Patent
Hauenstein

(10) Patent No.: US 6,777,766 B2
(45) Date of Patent: Aug. 17, 2004

(54) DEVICE FOR SENSING A MAGNETIC FIELD, MAGNETIC FIELD METER AND AN AMMETER

(75) Inventor: Henning M. Hauenstein, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/221,304
(22) PCT Filed: Dec. 21, 2001
(86) PCT No.: PCT/DE01/04854
§ 371 (c)(1), (2), (4) Date: Nov. 12, 2002
(87) PCT Pub. No.: WO02/056045
PCT Pub. Date: Jul. 18, 2002

(65) Prior Publication Data
US 2003/0183890 A1 Oct. 2, 2003

(30) Foreign Application Priority Data
Jan. 11, 2001 (DE) ......................................... 101 00 884

(51) Int. Cl.[7] .............................................. G01R 33/00
(52) U.S. Cl. ....................... 257/423; 257/421; 324/251; 327/521
(58) Field of Search ................................ 257/421, 423, 257/560, 563; 324/207, 251; 327/521; 330/6

(56) References Cited

U.S. PATENT DOCUMENTS 4,999,692 A   3/1991   Ristic et al.

OTHER PUBLICATIONS

*Improved Hall Devices Find New Uses*, ELECTRONICS, NY, Apr. 29, 1985, vol. 58, No. 17, pp. 59–61.
Roumenin et al., *A New Anisotropy Effect in the Amperometric Magnetic–Field Microsensors*, Sensors and Actuators A, Nov. 2, 1999, vol. 77, No. 3, pp. 195–198.
Lin et al., *A Novel Structure for Three–Dimensional Silicon Magnetic Transducers to Improve the Sensitivity Symmetry*, Sensors and Actuators A, Sep. 1, 1996, vol. 56, No. 3, pp. 233–237.

*Primary Examiner*—Minhloan Tran
*Assistant Examiner*—Thomas L Dickey
(74) *Attorney, Agent, or Firm*—Kenyon & Kenyon

(57) ABSTRACT

Proposed are a device, a magnetic-field sensor and a current sensor, the device having the feature that provision is made for a first magnetic-field sensing means, for a second magnetic-field sensing means, and for a third magnetic-field sensing means, a first output variable of the first magnetic-field sensing means being provided as a first input variable, a second output variable of the first magnetic-field sensing means being provided as a second input variable, the first input variable being provided as input variable for the second magnetic-field sensing means, and the second input variable being provided as input variable for the third magnetic-field sensing means.

9 Claims, 2 Drawing Sheets

DEVICE FOR SENSING A MAGNETIC FIELD, MAGNETIC FIELD METER AND AN AMMETER

BACKGROUND INFORMATION

The number of application ranges for magnetic-field sensors is increasingly growing, in particular, in the automotive sector. Magnetic field sensing can be used, inter alia, for non-contact, low-loss and floating measurement of currents. Examples are the determination of electrical operating parameters of generators and electric drives. Generally, currents from the milliampere range to the kiloampere range have to be measured, which requires a measuring range of five to six magnitudes.

The state of the art today is to measure magnetic fields, for example, of electric conductors, using magnetic-field sensors such as Hall sensors, bipolar magnetotransistors, magnetoresistive resistors, lateral magneto-FET structures, etc. A particularly sensitive component is the so-called "lateral magnetotransistor" whose functioning is based on the asymmetrical current distribution between two bipolar transistors which is generated by the magnetic field.

For currents in the milliampere range, even such components reach the limits of their sensitivity due to the low magnetic fields, typically in the $\mu T$ range. In the related art, therefore, small magnetic fields are amplified by so-called "flux concentrators" which cause the magnetic fields to be stronger at the location of the magnetic-field sensors by suitably shaping the respective electric conductors or by means of magnetic circuits made of highly permeable materials.

SUMMARY OF THE INVENTION

The inventive device for sensing a magnetic field, the inventive magnetic-field sensor and the inventive current sensor have the advantage over the background art that flux-concentrating aids can be dispensed with, which saves costs and reduces the required installation space. This is possible by increasing the sensitivity of the device according to the present invention. In this connection, the linear relation between the measuring signal and the magnetic field to be measured is substantially maintained.

It is particularly advantageous that provision is made for a fourth magnetic-field sensing means and for a fifth magnetic-field sensing means, an output variable of the second magnetic-field sensing means corresponding to an input variable of the fourth magnetic-field sensing means, and an output variable of the third magnetic-field sensing means corresponding to an input variable of the fifth magnetic-field sensing means. Thus, by varying the number of the cascade stages according to the present invention, it is possible to obtain different sensitivities, as required, by the connection in cascade of magnetic-field sensors. In this context, it is particularly advantageous that different magnetic-field sensing means are implemented on a single chip.

Moreover, it is an advantage that the first magnetic-field sensing means is a first lateral magnetotransistor, that the second magnetic-field sensing means is a second lateral magnetotransistor, and that the third magnetic-field sensing means is a third lateral magnetotransistor. In this manner, the sensitivity of LMT (lateral magnetotransistor) sensors can be increased according to the present invention by suitably cascading a plurality of such LMT components. By using the output current of one LMT element, i.e. according to the present invention, for example, one of the two collector currents, as the input current, i.e., according to the present invention, for example, as the emitter current, for a another LMT element, the asymmetry effect of the magnetic field on the current distribution in the LMT can be used several times. In this context, it is an advantage that an LMT sensor is already highly sensitive itself and therefore represents a good starting point for the optimization described herein. Alternatively, the presented increase in sensitivity can also be used for all other components working according to a similar principle, i.e., in which the values of two output variables are changed by a magnetic field.

It is also beneficial that the first output variable is a first collector current, that the second output variable is a second collector current, that the first input variable is the emitter current of the second lateral magnetotransistor, and that the second input variable is the emitter current of the third lateral magnetotransistor. This advantageously allows an increase in sensitivity, the relation between the magnetic field and the measuring signal nevertheless being linear for small magnetic fields.

DETAILED DESCRIPTION

Figure 1:
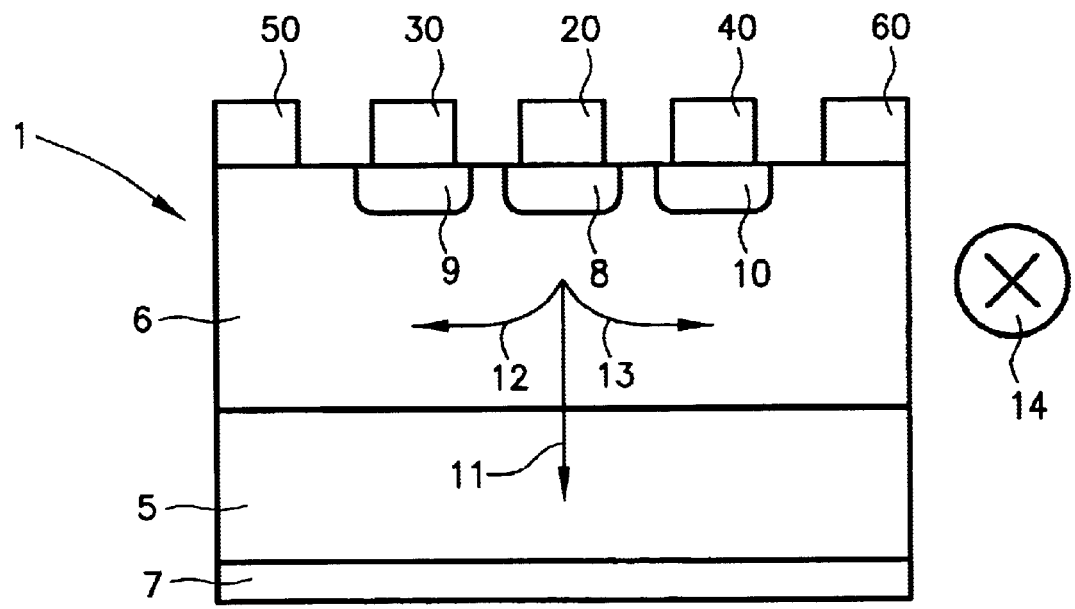
FIG. 1 shows a magnetic-field sensing means of the type of a lateral magnetotransistor.

In FIG. 1, a magnetic-field sensing means 1 is shown on the basis of a lateral magnetotransistor. An important feature hereof is that there are one input variable and two output variables, the values of the output variables being essentially equal when a magnetic field 14 is absent in the region of magnetic-field sensing means 1, and an asymmetry existing between a first output variable 12 and a second output variable 13 in the presence of a magnetic field 14. The inventive arrangement of magnetic-field sensing means can be used for any magnetic-field sensing means having this fundamental property.

In FIG. 1, a lateral magnetotransistor 1, also abbreviated as LMT 1, is shown as an example of a magnetic-field sensing means 1. LMT 1 includes a first semiconductor substrate layer 5 which is, for example, negatively doped and a second semiconductor substrate layer 6 which is, for example, positively doped. Underneath first semiconductor substrate layer 5, that is, opposite of second semiconductor substrate layer 6, for example, a first metallization layer 7 is provided for bonding. First metallization layer 7 constitutes a vertical collector of LMT 1. A first semiconductor substrate region 8, which is, for example, negatively doped, is embedded in second semiconductor substrate layer 6. Adjacent to first semiconductor substrate region 8, a second semiconductor substrate region 9 and a third semiconductor substrate region 10 are embedded in second semiconductor substrate layer 6, first semiconductor substrate region 8 being located in the middle between second semiconductor substrate region 9 and third semiconductor substrate region 10. The second and third semiconductor substrate regions 9, 10 are doped in the same way as first semiconductor substrate region 8. A first metallic contact 20, which constitutes the emitter contact of LMT 1, is disposed above first semiconductor substrate region 8. A second metal contact 30, which constitutes a first lateral collector of LMT 1, is located above second semiconductor substrate region 9. A third metal contact 40, which constitutes a second lateral collector of LMT 1, is arranged above third semiconductor substrate region 10. A fourth metal contact 50, which constitutes a first base terminal of LMT 1, is located next to second metal contact 30 on the opposite side of first metal contact 20. A fifth metal contact 60, which constitutes a second base terminal of LMT 1, is located next to third metal contact 40 on the opposite side of first metal contact 20.

In LMT 1, a current flows from emitter region 8, i.e., from first semiconductor substrate region 8, vertically downward. In FIG. 1, the first current is provided with the reference numeral 11. First current 11 corresponds to the input current to LMT 1 which is supplied via the emitter terminal. During operation, collector terminals 30, 40 are tied to the same potential and a second current 12 arises from emitter region 8 to first collector region 9, i.e., to second semiconductor substrate region 9 and, moreover, a third current 13 arises from emitter region 8 to second collector region 10, i.e., to third semiconductor substrate region 10. According to the present invention, first current 11 is either completely divided into second and third currents 12, 13, or a part of first current 11 flows to vertical collector 7. The first case is relevant especially when no vertical collector 7, which is also referred to as backside collector 7, is provided. In the second case, first current 11 is not completely divided into second and third current 12, 13, but a part of first current 11 flows to backside collector 7. In the ideal case, i.e., when there is no offset or when the offset is compensated for with sufficient accuracy, second current 12 and third current 13 are equal in the absence of magnetic field 14, i.e., when it disappears. When a magnetic field 14 is present which has a component pointing vertically into the image plane, a symmetry break occurs with regard to first and second currents 12, 13: one of the currents becomes larger.

Without magnetic field 14, in the ideal case, the two collectors 30, 40 are traversed by the same current. By an applied magnetic field 14 lateral to the chip surface, the charge carriers are deflected to the left or to the right due to the Lorenz force, depending on the direction of the magnetic field. In the Figure, a magnetic field 14 pointing vertically into the drawing plane results in that a higher current is applied to first collector 30; therefore, second current 12 is larger than third current 13, resulting in a relative unbalance of the two currents 12, 13. The current difference between first collector 30 and second collector 40 induced by magnetic field 14 is the measuring signal. The greater this difference for a given magnetic field strength, the higher is the sensitivity of the device.

Figure 2:
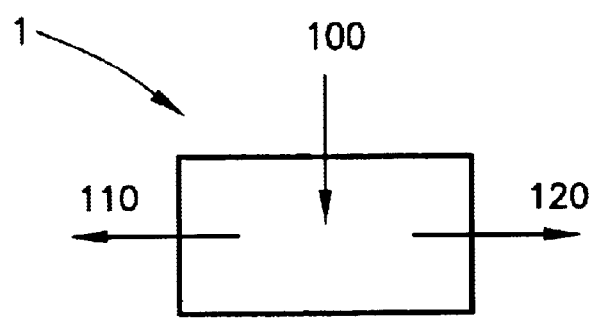
FIG. 2 is a schematic representation of a magnetic-field sensing means.

FIG. 2 is a schematic representation of an LMT 1, showing only an input variable, which corresponds to input current 11 and is now provided with reference numeral 100, a first output variable 110 and a second output variable 120.

FIG. 2 schematically shows an equivalent circuit diagram of LMT 1 depicted in FIG. 1. To first output variable 110 there corresponds, for example, first current 12, i.e., to the first collector current of LMT 1. To second output variable 120 there corresponds, for example, second current 13, i.e., to the second collector current of LMT 1. To input variable 100 there corresponds, for example, first current 11, i.e., the emitter current of LMT 1. The substrate current to vertical collector terminal 7, which is not necessarily required for the LMT principle, is not drawn in. For the measurement of the magnetic field, it is important for the field to induce as high as possible a change in the collector currents, in the example, the output variables 110, 120. The greater these change relative to the output variables 110, 120 flowing without magnetic field, the better is it possible to measure even small magnetic fields 14. Therefore, the sensitivity of an LMT element can be defined as the ratios η=(magnitude of the difference of output variables 110, 120 while magnetic field 14 is applied)/(magnitude of the sum of output variables 110, 120 when magnetic field 14 disappears). If input variable 100, i.e., for example, the input current at emitter 20, is assumed to be divided into the two output variables 110, 120 without losses, then it applies for an individual sensor element that:

First output variable $110 = \alpha *$ input variable 100 second output variable $120 = (1-\alpha) *$ input variable 100, where in the ideally symmetrical case without magnetic field it applies for asymmetry factor $\alpha$ that: $\alpha = 0.50$.

In this context, $\alpha$ is dependent on the magnetic field, which is also denoted by the letter "B". An asymmetry factor $\alpha$ which has been changed by the magnetic field is written as $\alpha(B)$. In the starting situation without magnetic field, it applies that $\alpha = \alpha(0)$.

In the presence of a third substrate collector current, which is not denoted by reference numerals, to vertical collector terminal 7, the proportion of the output variables, i.e., of lateral currents 110, 120, decreases according to the reduction of the third vertical current path, that is, not emitter current 11 but emitter current 11 minus the substrate current flowing to vertical collector 7 is taken as input variable 100. For an individual LMT element 1, measuring sensitivity η is derived as $$\eta = |2*\alpha(B)-1| \text{ for } \alpha(0)=0.50$$

Figure 3:
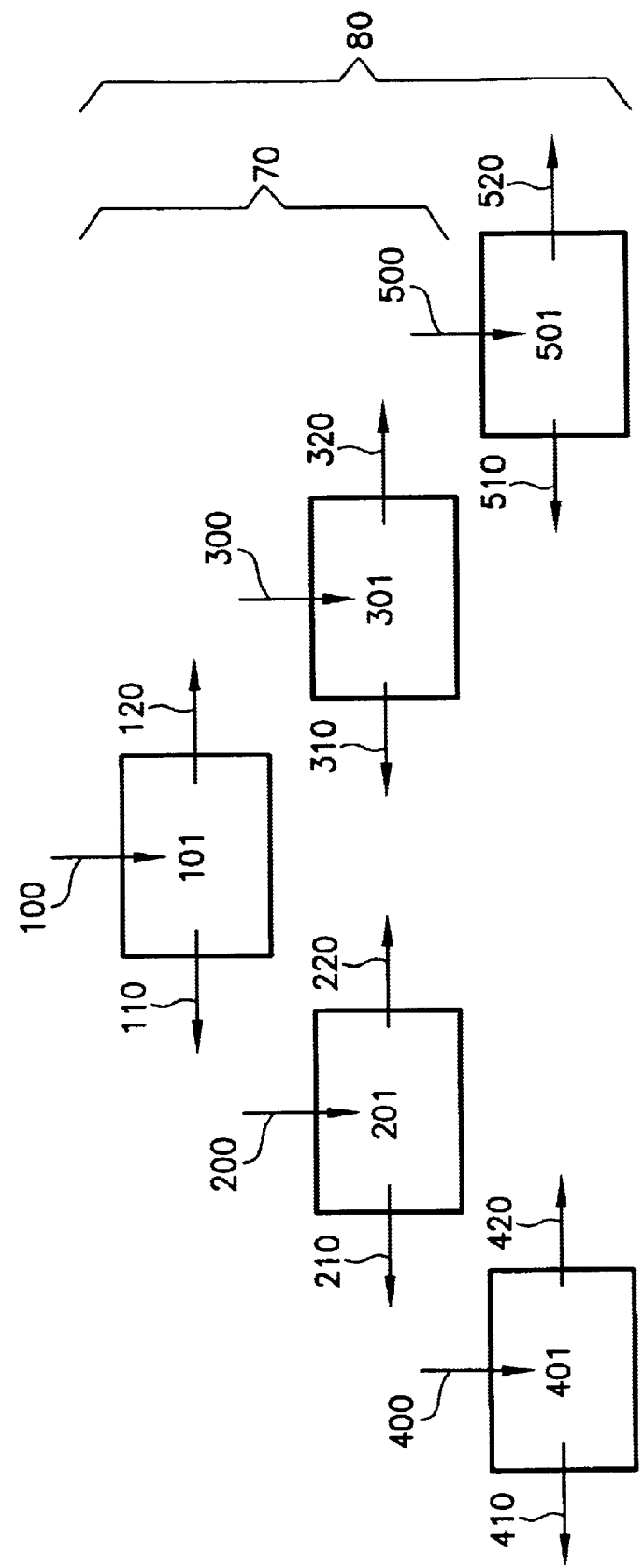
FIG. 3 shows an inventive arrangement of a plurality of magnetic-field sensing means.

In the presence of a magnetic field 14, $\alpha$ increases or decreases, depending on the field direction, with the component of magnetic field 14 that runs parallel to the surface of LMT 1. FIG. 3 shows an inventive arrangement of magnetic-field sensing means. All in all, a first magnetic-field sensing means 101, a second magnetic-field sensing means 201, a third magnetic-field sensing means 301, a fourth magnetic-field sensing means 401, and a fifth magnetic-field sensing means 501 are shown. The input variable of first magnetic-field sensing means 101 is provided with reference numeral 100. First magnetic-field sensing means 101 has first output variable 10 and second output variable 120 as the output variables. Second magnetic-field sensing means 201 has the input variable, which is provided with reference numeral 200, and, as output variables, first output variable 210 and second output variable 220 of second magnetic-field sensing means 201. Accordingly, third magnetic-field sensing means 301 has an input variable, which is provided with reference numeral 300. Third magnetic-field sensing means 301 has a first output variable 310 and a second output variable 320 as the output variables. The fourth magnetic-field sensing means has an input variable, which is provided with reference numeral 400, as well as a first output variable provided with reference numeral 410 and a second output variable provided with reference numeral 420. Fifth magnetic-field sensing means 501 has an input variable, which is provided with reference numeral 500, as well as a first output variable provided with reference numeral 510 and a second output variable provided with reference numeral 520. According to the present invention, first output variable 110 of first magnetic-field sensing means 101 is used as input variable 200 to second magnetic-field sensing means 201, and second output variable 120 of first magnetic-field sensing means 101 is used as input variable 300 to third magnetic-field sensing means 301. When first, second and third magnetic-field sensing means 101, 201, 301 produce an essentially equal relative unbalance of their output variables 110 and 120, and 210 and 220, and 310 and 320, respectively, as a function of an applied magnetic field 14, then the relative unbalance between first output variable 210 of the second magnetic-field sensing means and second output variable 320 of the third magnetic-field sensing means is greater than the unbalance between first output variable 110 of first magnetic-field sensing means 101 and second output variable 120 of first magnetic-field means 101. Given the same applied magnetic field 14, therefore, the sensitivity of the system composed of first magnetic-field sensing means 101 together with second magnetic-field sensing means 201 and third magnetic-field sensing means 301 is greater than the sensitivity of the first magnetic-field sensing means alone. Thus, according to the present invention, the possibility arises to cascade magnetic-field sensing means by adding further magnetic-field sensing means 201, 301, 401, 501, starting from first magnetic-field sensing means 101. In such a cascading arrangement, first magnetic-field sensing means 101 alone represents, as it were, the first stage of the cascade, second magnetic-field sensing means 201 and third magnetic-field sensing means 301 constitute the second stage of the cascade; first magnetic-field sensing means 101, second magnetic-field sensing means 201 and third magnetic-field sensing means 301 together forming a two-stage cascade 70. Accordingly, all five magnetic-field sensing means 101, 201, 301, 401, 501 constitute a three-stage cascade 80 of magnetic-field sensing means. According to the present invention, an arbitrary number of cascade stages can be provided. For the sake of simplicity, only the first three cascade stages are described by way of example.

Via the number of cascade stages, it is possible to obtain different sensitivities of the device according to the present invention as required. The connection in cascade of lateral magnetotransistors 101, 201, 301, 401, 501 can be implemented monolithically, that is, on a single chip. An LMT cascade chip, as an example for a cascade of magnetic-field sensing means, is able to cover a very large measuring range for which otherwise a combination of different sensor elements would have to be used according to the related art. In the case of such a device featuring different sensor elements, which cover different sensitivity ranges, each of these individual sensors would have to be adapted to different measuring ranges by control, for example, via an evaluation IC. This would be carried out, for example, by differently amplifying the signal to be evaluated. However, this would not improve the signal-to-noise ratio. According to the present invention, a great advantage of the cascading of magnetic-field sensing means proposed by the present invention is that the appropriate sensitivity range of the sensor can be selected and evaluated for each measuring signal strength.

According to the present invention, a cascade of a plurality of magnetic-field sensing means or of a plurality of LMT components serves to increase the measuring sensitivity of a device according to the present invention. The effect of magnetic field 14 is amplified in that the output current of an LMT element that is changed by magnetic field 14 is used in each case as the input current for the next LMT element and is consequently subject to the effect of the magnetic field again. In an n-fold cascade of magnetic-field sensing means, measuring sensitivity $\eta$ is calculated from the current difference of the two last cascade elements of the magnetic-field sensing means of the cascade as follows:

$$\eta_n : \eta_1 = |\alpha(B)^n - (1-\alpha(B))^n| / |\alpha(0)^n + (1-\alpha(0))^n|$$

The increase in sensitivity obtained by the cascade can be best described as the ratio of the sensitivities between the n-fold cascade ($\eta_n$) and the sensitivity of a single element ($\eta_1$):

$$\eta_n : \eta_1 = |\alpha(B_z)^n - (1-\alpha(B_z))^n| / \{[\alpha(0)^n + (1-\alpha(0))^n] \cdot |2\alpha(B_z) - 1|\}$$

If, in the ideal case, $\alpha(0)$ is assessed to be 0.50, it follows that:

$$\eta_n : \eta_{n1} = 2^{n-1} * |\alpha(B)^n - (1-\alpha(B))^n| / |2\alpha(B) - 1|$$

For small magnetic fields, i.e., $\alpha$ is approximately equal to 0.50, the sensitivity increases linearly with the number of cascade stages. The more magnetic-field sensing means are connected in cascade or the greater magnetic field 14, the faster increases sensitivity $\eta_n$. The loss of the linear relation between the measuring signal and the magnetic field for a cascade having more than two stages appears to be a disadvantage of the cascade connection. However, the non-linearity can, on one hand, be allowed for in the evaluation of the measuring signal; on the other hand, the non-linearity comes to the forefront only when a strongly deviates from 0.50, that is, for high magnetic fields. According to the present invention, however, the object of the present invention is primarily to increase the measuring sensitivity for small fields so that the cascade connection can be used, in particular, in the range of a approximately equal to 0.50. In this range, the inventive cascade connection of magnetic-field sensing means behaves linearly because it results for $\alpha = 0.50$ that $\eta_n = n * \eta_1$, the sensitivity increasing linearly with the number n of cascade stages.

The cascade connection according to the present invention can be implemented both with separate LMT elements and on a chip by linking individual LMT cells in a suitable manner. Control can take place, for example, via an ASIC. It is also possible to tap the measuring signal at different cascade stages so that the cascade depth to be evaluated can be selected as a function of the requested sensitivity. Moreover, the LMT operating points of different cascade stages can be set independently of each other, for example, via the selection of the respective base current, whereby offset or temperature effects can possibly be compensated for. Because it is in principle possible to set each operating point of the interconnected elements separately, the device according to the present invention can be combined with different control or evaluation concepts in an extremely flexible manner.

For a connection in cascade, it is not only conceivable to use the collector current as output variable and the emitter current as input variable but it is also conceivable to use two emitters as outputs and one collector as input of the following element. The third possibility of using the output current as base input for the following element promises an even higher increase in sensitivity.

Currently, LMT elements typically have an edge length of approximately 50 to 100 $\mu$m on a chip. Therefore, such elements can easily be cascaded by arranging the LMT elements in blocks, side by side, or in a different alignment on a chip. In this context, magnetic field 14 to be measured is assumed to be approximately equal at the locations of the various LMT elements situated on the chip, that is, magnetic field 14 is homogeneous over the chip region which is used for the measurement. This is an absolutely plausible assumption for the indicated dimensions of the sensor elements.

What is claimed is:

1. A device for sensing a magnetic field, comprising:
   a first magnetic-field sensing device;
   a second magnetic-field sensing device; and
   a third magnetic-field sensing device, wherein:
   a first output variable of the first magnetic-field sensing device is provided as a first input variable,
   a second output variable of the first magnetic-field sensing device is provided as a second input variable, the first input variable is provided as an input variable for the second magnetic-field sensing device, and the second input variable is provided as an input variable for the third magnetic-field sensing device.

2. The device as recited in claim 1, further comprising:

a fourth magnetic-field sensing device; and a fifth magnetic-field sensing device, wherein:

an output variable of the second magnetic-field sensing device corresponds to an input variable of the fourth magnetic-field sensing device, and an output variable of the third magnetic-field sensing device corresponds to an input variable of the fifth magnetic-field sensing device.

3. The device as recited in claim 1, wherein:

the first magnetic-field sensing device includes a first lateral magnetotransistor, the second magnetic-field sensing device includes a second lateral magnetotransistor, and the third magnetic-field sensing device includes a third lateral magnetotransistor.

4. The device as recited in claim 3, wherein:

the first output variable includes a first collector current, the second output variable includes a second collector current, the first input variable includes an emitter current of the second lateral magnetotransistor, and the second input variable is an emitter current of the third lateral magnetotransistor.

5. The device as recited in claim 3, wherein:

the first output variable includes one of a first emitter current and a first emitter voltage, the second output variable includes one of a second emitter current and a second emitter voltage, the first input variable includes one of a collector current and a collector voltage of the second lateral magnetotransistor, and the second input variable includes one of a collector current and a collector voltage of the third lateral magnetotransistor.

6. The device as recited in claim 2, wherein:

the first magnetic-field sensing device, the second magnetic-field sensing device, the third magnetic-field sensing device, the fourth magnetic-field sensing device, and the fifth magnetic-field sensing device are provided in a monolithically integrated form.

7. The device as recited in claim 1, further comprising:

an evaluation circuit, the evaluation circuit evaluating one of the following sets of variables as a function of the magnetic field:

the first output variable and the second output variable of the first magnetic-field sensing device, and an output variable of the second magnetic-field sensing device and an output variable of the third magnetic-field sensing device.

8. The device as recited in claim 1, wherein:

the device is included in a magnetic-field sensor.

9. The device as recited in claim 1, wherein:

the device is included in a current sensor.

* * * * *

UNITED STATES PATENT AND TRADEMARK OFFICE
CERTIFICATE OF CORRECTION

PATENT NO. : 6,777,766 B2
DATED : August 17, 2004
INVENTOR(S) : Henning M. Hauenstein It is certified that error appears in the above-identified patent and that said Letters Patent is hereby corrected as shown below:

Column 4,
Line 3, change "defined as the ratios" to -- defined as the ratio --

Column 6,
Line 15, change "when a strongly deviates" to -- when α strongly deviates --
Line 20, change "in the range of a" to -- in the range of α --

Signed and Sealed this

Twelfth Day of July, 2005

JON W. DUDAS
*Director of the United States Patent and Trademark Office*